United States Patent [19]

Gilleo et al.

[11] Patent Number: 4,747,211

[45] Date of Patent: May 31, 1988

[54] METHOD AND APPARATUS FOR PREPARING CONDUCTIVE SCREENED THROUGH HOLES EMPLOYING METALLIC PLATED POLYMER THICK FILMS

[75] Inventors: Kenneth B. Gilleo, Northfield; Stephen E. Chabot, Apple Valley; Marion A. Tibesar, Northfield, all of Minn.

[73] Assignee: Sheldahl, Inc., Northfield, Minn.

[21] Appl. No.: 58,520

[22] Filed: Jun. 5, 1987

Related U.S. Application Data

[63] Continuation-in-part of Ser. No. 12,624, Feb. 9, 1987, abandoned.

[51] Int. Cl.$^4$ ............................................. H04K 3/10
[52] U.S. Cl. .................................... 29/852; 101/126; 101/129; 118/50; 118/213; 427/96; 427/97
[58] Field of Search ............... 29/851, 852; 101/126, 101/129; 118/50, 213, 406; 429/96, 97; 174/68.5

[56] References Cited

U.S. PATENT DOCUMENTS

| | | |
|---|---|---|
| 2,419,694 | 4/1947 | Shuttleworth et al. . |
| 2,904,916 | 9/1959 | Stahmann . |
| 2,923,651 | 2/1960 | Petriello ............................ 29/851 X |
| 3,129,442 | 4/1964 | Leckie . |
| 3,138,095 | 6/1964 | Wells . |
| 3,172,358 | 3/1965 | Weiss . |
| 3,221,648 | 12/1965 | Weiss . |
| 3,221,649 | 12/1965 | Weiss . |
| 3,418,931 | 12/1968 | Wilford . |
| 3,453,957 | 7/1969 | Hamilton . |
| 3,536,005 | 10/1970 | Derrickson . |
| 3,741,116 | 6/1973 | Green et al. ...................... 101/126 X |
| 3,881,971 | 5/1975 | Greer et al. . |
| 4,173,928 | 11/1979 | Mitter . |
| 4,283,243 | 8/1981 | Andreades et al. .............. 427/97 X |
| 4,307,662 | 12/1981 | Mitter . |
| 4,360,570 | 11/1982 | Andreades et al. .............. 427/97 X |
| 4,383,494 | 5/1983 | Schillke et al. ........................ 118/50 |
| 4,386,116 | 5/1983 | Nair et al. . |
| 4,388,862 | 6/1983 | Thomas, Jr. . |
| 4,398,335 | 8/1983 | Lehrer . |
| 4,478,882 | 10/1984 | Roberto .............................. 118/50 |
| 4,507,852 | 4/1985 | Karulkar . |
| 4,519,760 | 5/1985 | Norell ................................ 118/213 |
| 4,582,563 | 4/1986 | Hazuki et al. . |
| 4,592,132 | 6/1986 | Lee et al. . |

FOREIGN PATENT DOCUMENTS 2143473 2/1985 United Kingdom ................ 101/129

Primary Examiner—Howard N. Goldberg
Assistant Examiner—Carl J. Arbes
Attorney, Agent, or Firm—Orrin M. Haugen; Thomas J. Nikolai; Frederick W. Niebuhr

[57] ABSTRACT

An apparatus and method for preparing conductive bridges to electrically couple discrete electrical conductors arranged on opposed surfaces of a common substrate. The method and apparatus utilized includes subjecting the bore or opening in the substrate to the force of vacuum applied through a vacuum diffusion barrier. The substrate is exposed to the vacuum source through a plurality of spaced-apart bores of relatively small diameter, with the vacuum diffusion layer being in the form of a web of filter paper tracking and moving in synchronism with the substrate. Conventional silk screening techniques are utilized to form the conductors and bridges, with polymer thick conductive fluids being employed as the printing medium. Multiple layers of conductors may be formed, with dual-sided circuitry being applied to the substrate. The multiple layers are fabricated by initially plating a layer of metal upon the exposed surface of the polymer thick conductive films, and thereafter printing a defined pattern of dielectric upon the electroplated copper. Subsequently, a second polymer thick conductive fluid is employed as a printing medium upon the surface of the dielectric, with contact to the copper being available through vias formed in the dielectric layer. Following cure of such second layer, the exposed surfaces may be plated with a film of copper, nickel or other suitable metal.

20 Claims, 3 Drawing Sheets

METHOD AND APPARATUS FOR PREPARING CONDUCTIVE SCREENED THROUGH HOLES EMPLOYING METALLIC PLATED POLYMER THICK FILMS

CROSS REFERENCE TO RELATED APPLICATION

This is a Continuation-in-Part of our co-pending application Serial No. 12,624, filed Feb. 9, 1987, now abandoned of Kenneth B. Gilleo et al, entitled "Method and Apparatus for Preparing Conductive Screened Through Holes".

BACKGROUND OF THE INVENTION

The present invention relates generally to an improved apparatus and cost-effective method for preparing printed circuitry including copper plated polymer thick films arranged on a substrate having conductive bridges formed thereon to electrically couple discrete electrical conductors arranged on opposed surfaces of a common substrate, and with the conductive bridge being characterized in that it extends uniformly along and through the walls of a bore formed in and through the common substrate. More particularly, the present invention relates to an improved method and apparatus for preparing improved dual-sided circuitry coupled through conductive bridges which electrically couple discrete electrical conductors by means of an improved conductive bridge extending along and through the inner wall of a bore formed through the common substrate as a substantial uniform continuation of the respective opposed electrical conductors. In order to complete preparation of the improved conductor arrangement of the present invention, the following sequence of operations is normally undertaken:

1. A conductive ink in the form of a polymer thick film is screen printed onto opposed surfaces of a pre-punched substrate utilizing polymer thick films prepared and cured in accordance with the present invention;

2. Electroplate all surfaces of the cured conductors with a film of a conductive metal such as copper, nickel or other suitable metal or platable metal or alloy. Alternatively, electroless plating may be employed, even though electroless plating may have a much slower deposition rate;

3. Screen-print a dielectric ink pattern upon the metallic coating, such as copper or nickel, leaving via openings wherever an interconnect is required;

4. Screen-print a second layer of polymer thick film onto both surfaces, and effect an interconnection to the metal-plated circuit i.e. copper or nickel through the vias; and 5. Electroplate both of the opposed surfaces with a film of metal such as copper or nickel.

Through the utilization of this process, multilayered dual-sided circuitry having exceptional electrical and physical properties may be fabricated.

Plated-through holes are widely employed as a method of interconnecting conductors disposed on different planes of a substrate, particularly conductors disposed on opposite sides of a pre-punched common substrate, as well as conductors disposed on separate or individual substrates. Accordingly, plated-through holes frequently form the conductive bridge between such conductors or conductive patterns. In the past, various techniques have been used to provide electrically conductive bridges or interconnects on a through-hole basis. While attempts have been made to successfully form such conductive bridges utilizing a screened through-hole process, such attempts have previously proved to be impractical with results that prove unreliable. In accordance with these prior efforts, a curable liquid conductive ink coating was typically applied to the substrate, and printed in sufficient quantity so that a portion of the conductive coating would be designed to extend on a uniform basis integrally through the bore so as to coat the wall surfaces and provide the conductive bridge performing the electrical interconnect function. In order to increase reliability, redundant openings as well as separate mechanical interconnects have typically been utilized in the past to provide reliable and durable interconnects extending from one side of the substrate to the other. The screened through-hole process of the present invention essentially eliminates the need for redundant interconnects. Additionally, the copper plating of the polymer thick film pattern makes it possible to fabricate multilayered circuitry with interconnects extending through from one plane to another, including interconnects between adjacent planes or layers of circuitry, as well as interconnects extending across bores formed in the substrate.

In order to reduce space and volume requirements, and also to provide for appropriate density of circuitry, it is, of course, desirable if not requisite to employ double-sided circuitry on flexible substrates. Multilayer circuitry enhances the utility and versatility of such circuitry. Typically, one circuit pattern will be initially delineated on one surface of the substrate by silk screen printing of a curable liquid conductive ink coating, with the conductive ink coating being curable through exposure to an external energy source such as ultraviolet radiation and/or heat. Such conductive inks as well as their curing capabilities when cured are frequently referred to as "polymer thick films", and are well known and in common use in the printed circuitry art, and are, of course, commercially available. Following printing and curing of the first conductive ink pattern, a second conductive ink pattern is then formed on the opposed surface of the substrate. The substrate, having conductive patterns disposed on both major surfaces, is capable of functioning as one or more conductive patterns or conductors in an assembly or array of conductors. Typically, utilizing the features of the present invention, conductors prepared from polymer thick films having a thickness of from about 0.3 mil up to about 3-4 mils are easily and readily prepared. Material for the substrate, while not critical to the operation, is preferably flexible and fabricated from stress-oriented polyethylene terephthalate and having a thickness that may range from between about 1 mil and 20 mils, with a thickness range of between 2 mils and 10 mils being generally preferred. At greater thicknesses, such as thicknesses greater than about 20 mils, certain operations in the process must be run at a slower rate in order to achieve appropriate and desirable cures. Such substrate materials are, of course, commercially available.

In order to preserve the integrity of the circuit pattern, and in order to appropriately provide for preparation of a coating delineated as a circuit pattern on the flexible substrate, a supply web of a generally impervious flexible substrate (stress-oriented polyethylene terephthalate) is provided with a number of bores which are formed in the substrate so as to accommodate electrical interconnects where desired. For preparation of a first conductive pattern along one surface of the flexible substrate supply web, this web is initially superimposed over a second substrate, the second substrate being a generally porous, flexible non-woven web material which in the present operation, functions as a vacuum diffusing carrier web. This non-woven flexible web is pervious to air, but impervious to curable liquid conductive inks, thereby adapting its use toward that of a vacuum diffusing carrier web in the method and apparatus of the present invention.

In accordance with further features and operations of th present invention, the superimposed web pairs are moved along a path within a substrate printing zone wherein the webs traverse at least a portion of the arcuate periphery of a cylindrical printing pad having an outer annular wall surrounding a hollow core coupled to a source of vacuum. The outer annular wall is perforated with a plurality of bores to provide a perforate rotating printing cylinder for carrying the web pair at a predetermined peripheral rate of speed thereacross. While the web pair traverses the surface of the perforate cylindrical printing pad, a layer of curable liquid conductive ink is applied to the surface of the substrate through a superimposed silk screen, with the applied vacuum tending to draw the conductive ink coating through the substrate, and with the air-pervious vacuum diffusing carrier web trapping the conductive ink and thus controlling its movement, travel, and ultimate disposition.

The porous non-woven flexible vacuum diffusing carrier web is typically fresh filter paper or other porous fabric, with the material having a preferred thickness of between about 5 mils and 8 mils, and a weight of about 1.28 ounces per square yard. Such filter papers are, of course, commercially available and have been found to function well as a flexible vacuum diffusing carrier web pervious to air but impervious to curable liquid conductive inks. As a follow-up to the preparation of the first conductive pattern along one surface of the flexible substrate supply web, the operations undertaken for the preparation of the first conductive pattern are repeated on the opposed surface of the substrate supply web so as to form the second conductive pattern on the opposed major surface of the web.

In order to provide multilayer capability on the previously coated web, a film or layer of copper, nickel or other suitable metal is electroplated simultaneously onto both surfaces of the substrate. Thereafter, a dielectric film is printed upon the copper plating with vias formed through the dielectric film so as to permit coupling to the copper-plated layer therebeneath. Following completion of the formation of the dielectric film, a second polymer thick film is coated upon the substrate, this second film being applied directly over the dielectric film layer just formed. Thereafter, the outer surface of the second polymer thick film may be plated with copper, nickel or other suitable metal, thereby providing a highly durable and highly reliable multilayered dual-sided circuit. The final oouter layers of electroplated metal may be further plated with a non-oxidizing or nobel metal such as gold or possibly silver.

SUMMARY OF THE INVENTION

Therefore, it is a primary object of the present invention to provide an improved method and apparatus for the preparation of screened through-holes for printed circuitry, so as to provide for reliable conductive bridging of selected conductors of circuit assemblies formed on opposite sides of a common substrate or on separate substrates.

It is a further object of the present invention to provide an improved method and apparatus for preparing screened through-holes on flexible printed circuitry, wherein holes formed in the substrate are coated with a curable liquid conductive ink coating, and wherein a porous or semi-porous flexible vacuum diffusing carrier web cooperates with the substrate web so as to provide for reliable coating of the holes.

It is yet a further object of the present invention to provide an improved method and apparatus for preparing screened through-holes on flexible printed circuitry, and further preparing multilayered dual-sided circuitry wherein holes formed in the substrate are initially coated with a curable liquid conductive ink coating on both major surfaces thereof, and wherein a porous or semi-porous flexible vacuum diffusing carrier web cooperates with the substrate web so as to provide for reliable coating of the holes; the circuitry pattern being thereafter plated up with copper, nickel or other suitable metal and thereafter coated with a dielectric to provide the multilayer arrangement.

Other and further objects of the present invention will become apparent to those skilled in the art upon a study of the following specification, appended claims, and accompanying drawing.

IN THE DRAWINGS

DESCRIPTION OF THE PREFERRED EMBODIMENT

Figure 1:
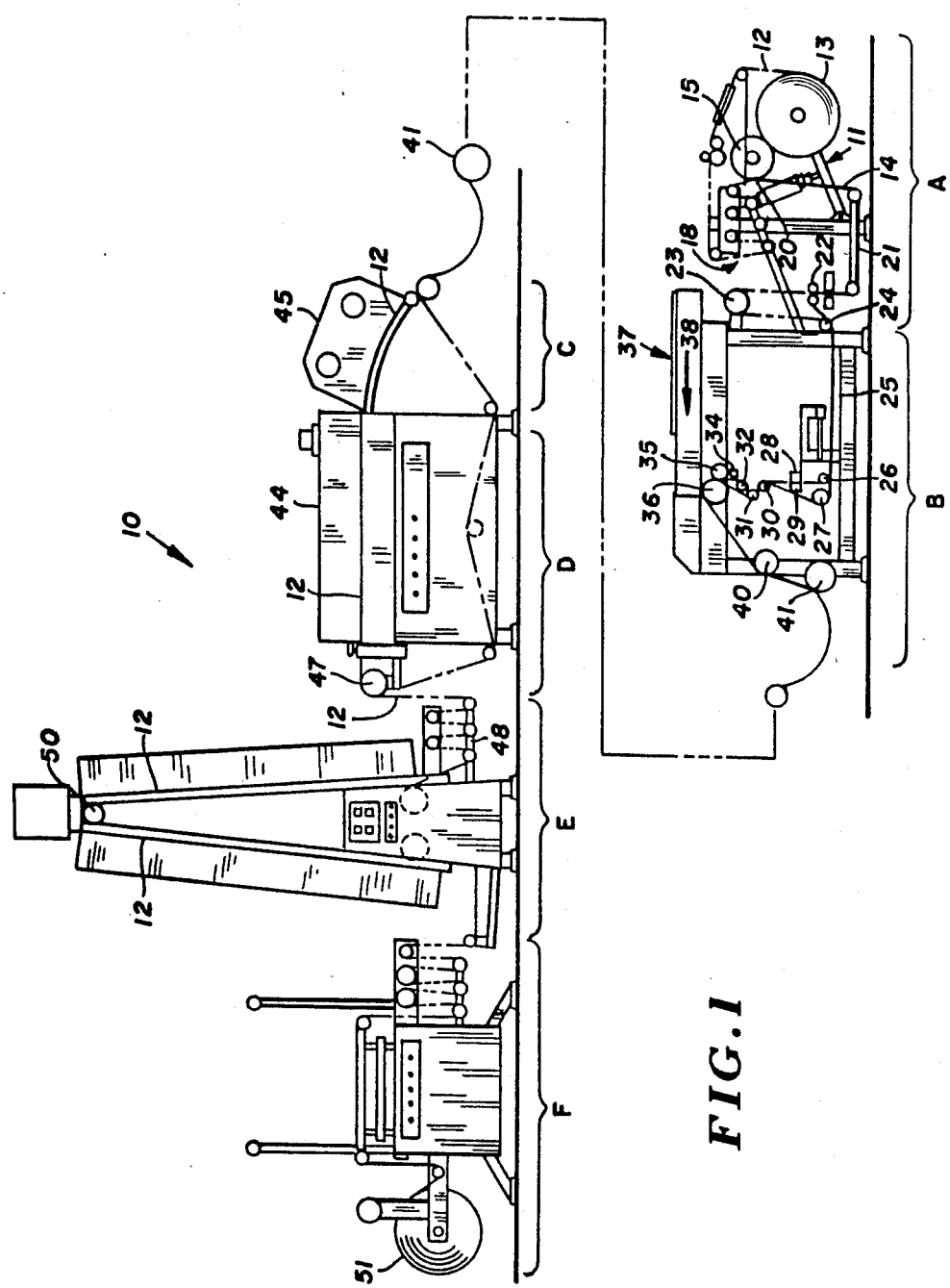
FIG. 1 is a side elevational view of a typical system for circuitry printing and drying operations to be undertaken on a roll-to-roll basis.
Figure 2:
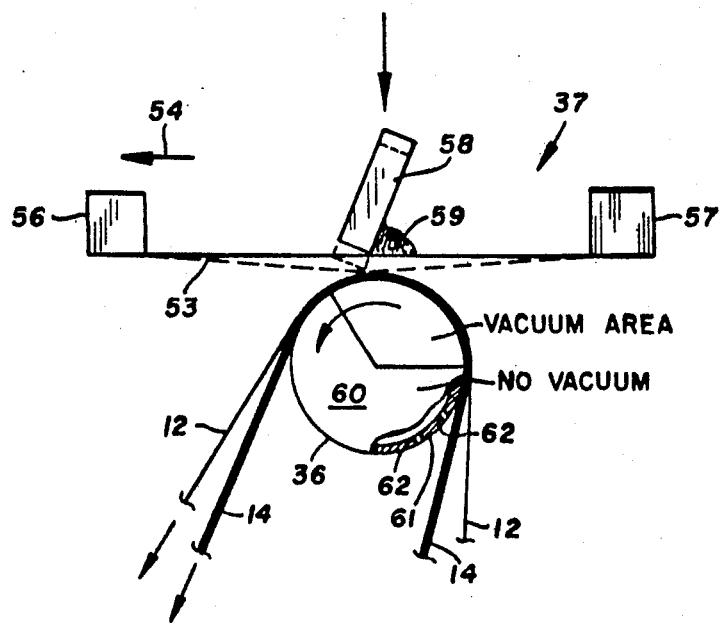
FIG. 2 is a detail side elevational view on a slightly enlarged scale of the printing station employed in the system illustrated in FIG. 1 and setting forth details of a cylinder screen printing station, being shown partially broken away.

In accordance with the preferred embodiment of one aspect of the present invention as set forth in FIGS. 1 and 2 of the drawings, the circuitry printing and drying system generally designated 10 is shown with the system including an unwind station portion or segment designated "A", a screen printing apparatus designated "B", an ultraviolet exposure/drying station designated "C", a horizontal drying section or station "D", a vertical dryer station designated "E", and a rewind station designated "F". The unwind station "A" includes an unwind mechanism as at 11 supplying circuitry substrate web 12 from roll 13 along with filter paper web 14 drawn from filter paper supply roll 15. As will become more apparent later, two separate passes for the substrate web 12 will be undertaken, with a suitable coating of polymer thick film being applied to one major surface of the substrate web 12 on each pass.

While the treatment on each of the polymer thick film coating passes are identical, one to the other, the operation is undertaken for the first pass in a manner set forth hereinafter. In this connection, substrate web 12 is initially fed through a plurality of dancer rolls shown generally at 18, and with the filter web and substrate web meeting in superposed relationship along the supply webs such as at 20. The substrate/filter paper webs move together along guide and tensioning stations as at 21, with the webs being separated guide roll station 22, with the substrate web traveling over idler 23 and joining the filter paper web at idler 24. The webs move together through a span as at 25, and are again separated at drive roll 26 and roll 27 in order to permit independent passage through a pair of web tracking sensors as at 28 and 29. After passing through a group of idler rollers as at 30, 31 and 32, the substrate web 12 passes through a registration sensor as at 34, with filter paper web 14 bypassing sensor 34. Sensor 34 in effect functions as a progression control in the overall printing operation.

From registration sensor 34, the filter paper and substrate meet at the juncture between roll 35 and print cylinder 36, with print cylinder 36 being provided with vacuum openings to control the printing operation as more specifically pointed out hereinafter. While passing over the surface of print cylinder 36, screen printing assembly generally designated 37 is designed to move reciprocably to-and-fro, with the screen printing occurring during motion of the screen printing assembly 37 in the direction of arrow 38. As can be appreciated, motion in the direction 38 is performed in synchronism or otherwise in time with the rotational motion of print cylinder 36, for purposes hereinafter more specifically defined.

Following passage through the print station, including passage over a portion of the circumference of print cylinder 36, the printed substrate along with the filter paper track as a composite web or web pair across drive roll 40, with the filter paper being rewound on take-up roll 41, with take-up or rewind roll 41 providing controlled torque which results in constant tension in the filter paper web 14 as it passes through the printing station across print cylinder 36.

Following passage through the screen printer "B", substrate web 12 having a polymer thick film coating thereon (through application in screen printer station "B") with the substrate being carried by vacuum transport belt through horizontal dryer 44. In FIG. 1, an ultraviolet drying station "C" is shown, and is provided as an operating station in the system. It will be noted, however, that exposure to ultraviolet is not required in all instances, with such exposure being utilized in connection with certain polymer films, and also being used for achieving cure of certain dielectric coatings. Ultraviolet source 45, when employed, cures certain components present in the polymer thick film applied to the surface of substrate web 12, with the cure of the polymer coating being primarily completed within the horizontal dryer 44. Following passage through ultraviolet/drying station "C" and horizontal dryer "D", web 12 passes over vacuum transport cylinder 47, dancer assembly generally designated 48 and is carried by a vacuum transport belt through the vertical dryer "E". Web 12 continues its movement through vertical dryer "E" across idler 50, and ultimately into rewind station "F", as indicated at rewind roll 51.

Attention is now directed to FIG. 2 of the drawings wherein print cylinder 36 is illustrated in combination with the screen printer, specifically screen printer assembly 37. Silk screen 53 is arranged in taut configuration between retainer blocks 56 and 57, with a doctor blade sometimes referred to as a squeegee, as at 58 being arranged to collect raw polymer thick film forming indicia printing material as at 59 and arrange for appropriate passage through the openings formed in the silk screen 53. Silk screen assembly or screen printing assembly 37 as illustrated in FIG. 2 moves in the direction of arrow 54 in time with the rotational motion of print cylinder 36, as is, of course, well known in the art.

As indicated in FIG. 2, the filter paper web 14 moves in synchronism with substrate web 12, with the filter paper web 14 being positioned adjacent the surface of print cylinder 36. Typically, the web pair is trained across the surface of cylindrical printing cylinder 36 for less than approximately 180° of arc, with a range of approximately 115° of arc having been found to be desirable.

Cylinder 36 is in the form of an annular cylindrical ring 61 surrounding a segmented hollow core 60. Radially extending bores shown in exaggerated size due to limitation of draftsmanship are illustrated as formed in ring 61, as at 62—62. Vacuum is applied to a portion of the hollow core 60, which, in effect, induces the passage of air through filter paper web 14 while webs 12 and 14 are being moved across the surface of cylinder 36, such as within approximately 120° of arc within the interior confines of cylinder 36 as illustrated in FIG. 2. In this arrangement, therefore, the filter paper web 14 functions as a vacuum diffuser, and aids in the arrangement and positioning of the liquid polymer thick film 59 as it is posed upon the surface of substrate 12 in the area of through-holes formed in circuitry substrate web 12.

As indicated hereinabove, substrate web 12 is preconditioned and partially prepared, and contains a plurality of bores formed therein to accommodate receipt of a conductive polymer, which upon curing, forms electrically conductive interconnects between portions of circuitry arranged on opposite sides of web 12. In this connection, and as previously indicated, the web 12, after undergoing curing of the polymer thick film applied to the first surface thereof, is passed through the entire system a second time so as to form a desired circuit pattern on the opposed side of web 12. This second pass arranges a coating of polymer thick film on both surfaces of the web 12, thus providing the double-sided capability.

The function of the filter paper, as a vacuum diffuser, assists the printing operation in that the raw liquid polymer is drawn into the opening or bore formed in impervious substrate web 12, with any access and/or residue being retained on the surface of the filter paper. Filter paper web 14, therefore, functions as a collector of raw polymer thick film coating, and in effect controls the amount of the film left in the area of the through-holes formed in web 12.

SEMI-POROUS WEB

In carrying out the coating operations of the present invention, the filter paper is utilized to perform the function in the form of a porous or semi-porous web. This semi-porous web functions in cooperation with the circuit substrate web 12. Typically, this filter paper is in the form of a non-woven web having a thickness of approximately 6 mils and a density of about 1.28 ounces per square yard.

THE PRINT CYLINDER

Print cylinder 36 is provided with spaced apart vacuum ports to permit air to pass through the paper, after having passed through openings formed in web 12. These ports are preferably of uniform size and spacing, with the openings being approximately 0.032 inch in diameter, with larger diameter openings being, of course, useful. In a system utilizing holes or bores of approximately 0.030-0.036 inch in the print cylinder, these openings are spaced apart at 0.4 inch centers. With holes of 0.032 inch in diameter placed at 0.4 inch centers, the cylinder will have an open area of approximately 1 percent, it being understood that the perforations may be of such density and size so as to comprise between about 1 percent and 15 percent of the segmented vacuum print cylinder 36. It is understood, of course, that holes having a diameter of up to about 0.08 inch and larger may be employed with the system of the present invention.

THE POLYMER THICK FILM

The polymer thick film is selected from those commercially available polymer films having conductive fillers. Specifically, polymer thick films filled with silver, copper, nickel, carbon or blends thereof may be employed. The arrangement of the present invention has been found to function properly with the raw film having a viscosity of between 25,000 and 75,000 centipoises.

FLAT BED SCREEN PRINTING

Figure 3:
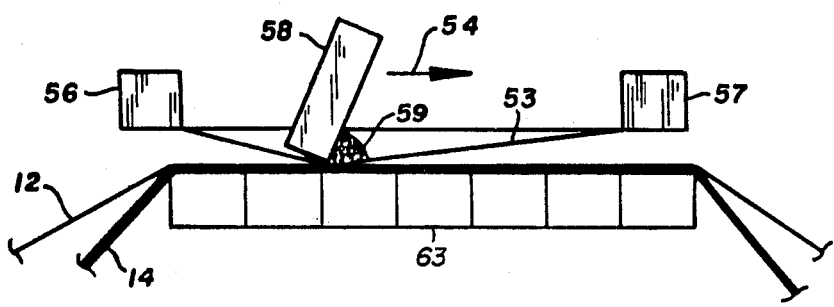
FIG. 3 is a side elevational view of a modified form of printing station employing flat-bed screen printing.

With attention being directed to FIG. 3 of the drawings, it will be observed that the coating system of the type as set forth in FIG. 2 utilizes a flat diffuser bed in lieu of the cylindrical print cylinder shown in FIGS. 1 and 2. Specifically, and as illustrated in FIG. 3, the functions of print cylinder 36 are undertaken by flat bed diffuser printer plate 63. In this arrangement, however, relative motion between flat bed print plate 63 and screen 53 is accomplished by linear motion of either screen printing assembly 37 or, alternatively, flat bed print plate 63. In the example shown in FIG. 3, the arrangement illustrates linear motion of screen printer assembly 37.

OPTIONAL POST-PROCESSING

Depending upon the end use of the polymer thick film products, it may, in certain instances, be deemed desirable to plate the surface of the polymer thick films with a conductive metal such as copper or nickel. Such an operation if, of course, optional inasmuch as the conductive polymer thick films are useful without undergoing any post-processing operations.

When the cured polymer thick films are coated with a conductive metal such as copper or nickel, conventional electroplating or electroless plating operations are employed with both sides of the substrate being plated with the conductive metal simultaneously. Metal plating operations on such polymer thick films are, of course, known and understood in the art and need not be specifically described herein.

Figure 4:
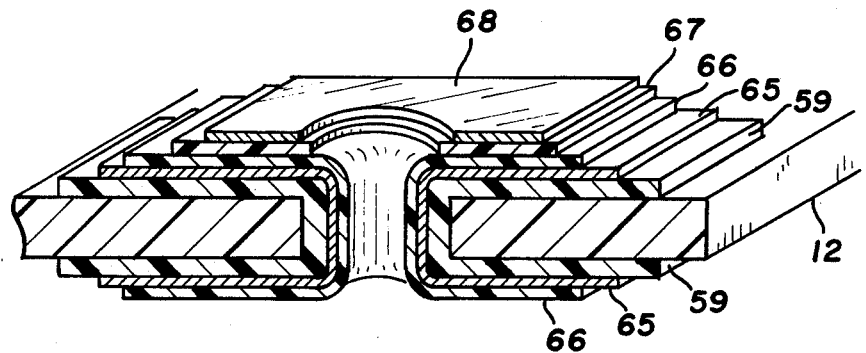
FIG. 4 is a partial perspective view, cut-away along a vertical plane so as to expose multiple layers of circuitry formed in accordance with the present invention.
Figure 5:
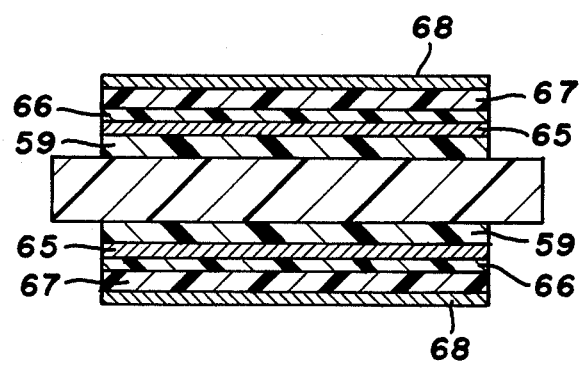
FIG. 5 is a vertical sectional view taken through a substrate and illustrating a typical arrangement of multilayered, dual-sided circuitry fabricated in accordance with the present invention.

Following the formation of a conductive coating or plating of metal such as copper or nickel onto the polymer thick film, the multilayer capability of the circuitry may be further developed. In this connection, and with particular attention being directed to FIGS. 4 and 5 of the drawings, the substrate web 12 is shown with its first coating of polymer thick film 59 on opposite surfaces thereof. The outer surface of the conductive film 59—59 is thereafter plated with a layer of metal such as copper or nickel 65, with conventional plating techniques being appropriately employed.

Following the metal plating operation, a dielectric film such as is illustrated at 66—66 is applied to the copper surfaces, with appropriately placed or disposed vias being formed in the film 66—66. The vias in the dielectric film are utilized to arrange the multilayered capability for each side of the dual-sided single substrate circuitry arrangement.

Dielectric film 66—66 may be selected from any of the conventional dielectric film forming materials, with suitable dielectric films being available and selected from such materials as polyester materials and/or epoxy base materials. Such dielectric film forming materials are, of course, commercially available and are applied to the electroplated copper in a conventional fashion, such as screen printing.

Following curing of the dielectric film 66—66, a second layer of polymer thick film such as is illustrated at 67—67 is applied to opposed surfaces of the substrate 12, with the second layer of polymer thick film being applied directly over cured dielectric film 66—66. Following completion of cure for the second coating of polymer thick film 67—67, a further metal plating operation may be undertaken to form a layer of metal such as at 68—68 upon the opposed surfaces of the polymer thick film. Copper is generally preferred although for some applications, nickel is the preferred conductive metal. This arrangement provides a durable, reliable, and highly economical multilayer, dual-sided circuitry arrangement with interconnects being available through the substrate carrier 12, as well as through vias formed in the dielectric film 66—66. Noble metal coatings may also alternatively be applied.

It will be understood, of course, that various modifications may be made to the foregoing disclosure without departing from the spirit and scope of the claims.

What is claimed is:

1. In the method of preparing conductive bridges to electrically couple discrete electrical conductors arranged on opposed surfaces of a common substrate with the conductive bridge extending along and through the walls of a bore formed through the common substrate as a continuation of the respective opposed electrical conductors, said method comprising the steps of:
    (a) preparing a screen layout of the circuit pattern to be formed and mounting said screen layout under tension for use in printing a delineated curable liquid conductive ink coating defining the said circuit pattern to be formed upon the substrate surface;
    (b) preparing a supply web of a generally impervious flexible substrate to receive said circuit pattern and with bores being formed therein to accommodate electrical interconnects between circuit patterns to be formed on the opposed major surfaces thereof;
    (c) superimposing said flexible substrate upon a generally porous non-woven flexible vacuum diffusing carrier web pervious to air but impervious to said curable liquid conductive ink for simultaneous passage with said substrate as a web pair through a substrate printing zone;

(d) passing said superposed substrate vacuum diffusing carrier web pair along a path within a substrate printing zone wherein said web pair traverses the surface of a printing bed plater with the printing bed having an outer surface enclosing a hollow core and with a plurality of bores formed through said outer surface to provide a perforated printing surface, moving said printing bed plate surface relative to a screen print layout while carrying said web pair thereover;

(e) coupling the hollow core of said printing bed to a source of vacuum;

(f) applying a layer of said curable liquid conductive ink coating upon the surface of said flexible substrate through said screen layout while simultaneously applying vacuum to the hollow core of said printing bed and through the bores formed through the annular wall thereof and through said air-pervious vacuum diffusing carrier web.

2. The method as defined in claim 1 being particularly characterized in that said printing bed is a printing cylinder and said substrate vacuum diffusing carrier web is trained across the surface of printing cylinder for less than approximately 180 degrees of arc.

3. The method as defined in claim 1 being particularly characterized in that said screen layout is moved linearly in synchronism with the rotatable arcuate movement of the surface of said printing cylinder.

4. The method as defined in claim 3 being particularly characterized in that said screen layout is moved linearly along a plane substantially tangent to the surface of said printing cylinder.

5. Apparatus for the preparation of conductive bridges to electrically coupled discrete electrical conductors arranged on opposed surfaces of a common substrate with the conductive bridge extending along and through the walls of a bore formed through the common substrate as a continuation of the respective opposed electrical conductors, said apparatus comprising:

(a) printing screen retaining means arranged to support a screen print layout for use in printing a delineated circuit pattern with curable liquid conductive ink upon a substrate surface, said printing screen retaining means including mounting means for guidably maintaining said screen print layout in operative disposition within a printing station;

(b) a printing station for receiving a substrate to be printed, and means for applying a layer of a curable liquid conductive ink upon selected regions of the surface of a substrate positioned within said printing station;

(c) means for guidably moving a supply web of a generally impervious flexible substrate through said printing station to receive said circuit pattern in the form of a layer of a curable liquid conductive ink and with bores being formed therein to accommodate electrical interconnects between circuit patterns to be formed on the opposed major surfaces of said substrate;

(d) means for guidably moving a generally porous, non-woven flexible vacuum diffusing carrier web pervious to air but impervious to said curable liquid conductive ink for simultaneous passage with said substrate as a web apir through said printing station;

(e) said printing station including a printing cylinder having an outer annular wall surrounding a hollow core and with a plurality of bores formed through said annular wall to provide a perforated cylindrical surface, mounting means for said printing cylinder arranged to rotatably support said printing cylinder for axial rotation within said printing station in registration with and in synchronism with said printing screen;

(f) means for rotating said printing cylinder at a rate synchronized with the lineal movement of said superposed web pair through said printing station;

(g) means coupling the hollow core of said printing cylinder to a source of vacuum; and (h) means for applying a layer of said curable liquid conductive ink coating upon the surface of said flexible substrate through said screen layout while simultaneously applying vacuum to the hollow core of said printing cylinder and through the bores formed in the annular wall thereof and through said air-pervious vacuum diffusing carrier web.

6. The apparatus for preparation of conductive bridges to electrically coupled discrete electrical conductors as defined in claim 5 being particularly characterized in that said means for guiding the web pair are disposed to carry the said pair along a path over said printing cylinder wherein said pair is firmly draped across approximately 115 degrees of arc of the periphery of said printing cylinder.

7. The apparatus for preparation of conductive bridges to electrically coupled discrete electrical conductors as defined in claim 5 being particularly characterized in that said perforated surface comprises uniformly spaced circular holes of substantially uniform diameter and wherein said perforations are comprise between about 1% and 15% open, balance annular wall surface.

8. The apparatus for preparation of conductive bridges to electrically coupled discrete electrical conductors as defined in claim 7 being particularly characterized in that said holes are less than about 0.080 inch in diameter.

9. The apparatus for preparation of conductive bridges to electrically coupled discrete electrical conductors as defined in claim 5 being particularly characterized in that said screen print layout, substrate and diffusing layers are maintained in registered alignment through said printing station.

10. The apparatus for preparation of conductive bridges to electrically coupled discrete electrical conductors as defined in claim 5 being particularly characterized in that said printing screen retaining means moves linearly along a reciprocating path in synchronism with the rotation of said printing cylinder.

11. The apparatus for preparation of conductive bridges to electrically coupled discrete electrical conductors as defined in claim 5 being particularly characterized in that said curable liquid ink has a viscosity of between about 25,000 and 75,000 centipoises.

12. The apparatus for preparation of conductive bridges to electrically coupled discrete electrical conductors as defined in claim 11 being particularly characterized in that said porous medium is a filter paper of a thickness ranging from between about 5 mils and 8 mils, and a weight of about 1.28 ounces per square yard.

13. The apparatus for preparation of conductive bridges to electrically coupled discrete electrical conductors as defined in claim 5 being particularly characterized in that said means for guidingly moving said flexible substrate web includes means for maintaining a substantially constant tension on the web through the printing station.

14. In the method of preparing conductive bridges through bores formed in a substrate to electrically couple discrete electrical conductors arranged on different surfaces, with the conductive bridge extending along and through walls of a bore formed through the substrate as a continuation of the respective electrical conductors, said method comprising the steps of:
   (a) preparing a screen layout of the circuit pattern to be formed and mounting said screen layout under tension for use in printing a delineated curable liquid conductive ink coating defining the said circuit pattern to be formed upon the substrate surface;
   (b) preparing a supply web of a generally impervious flexible substrate to receive said circuit pattern on one surface of said flexible substrate and with bores being formed therein to accommodate electrical interconnects between the circuit patterns to be formed on said one surface of said flexible substrate and a circuit pattern disposed on a surface different from that of said flexible substrate surface;
   (c) superimposing said flexible substrate upon a generally porous non-woven flexible vacuum diffusing carrier web pervious to air but impervious to said curable liquid conductive ink for simultaneous passage with said substrate as a web pair through a substrate printing zone;
   (d) passing said superposed substrate vacuum diffusing carrier web pair along a path within a substrate printing zone wherein said web pair traverses at least a portion of the arcuate periphery of a printing cylinder having an outer annular wall surrounding a hollow core and with a plurality of bores formed through said annular wall to provide a perforated cylindrical surface, rotating said printing cylinder while carrying said web pair thereover at a peripheral rate of speed substantially equal to the lineal rate of speed of said superposed pair;
   (e) coupling the hollow core of said printing cylinder to a source of vacuum;
   (f) applying a layer of said curable liquid conductive ink coating upon the surface of said flexible substrate through said screen layout while simultaneously applying vacuum to the hollow core of said printing cylinder and through the bores formed through the annular wall thereof and through said air-pervious vacuum diffusing carrier web.

15. In the method of preparing conductive bridges to electrically couple discrete electrical conductors arranged on opposed surfaces of a common substrate with the conductive bridge extending along and through the walls of a bore formed through the common substrate as a continuation of the respective opposed electrical conductors, said method comprising the steps of:
   (a) preparing a screen layout of the circuit pattern to be formed and mounting said screen layout under tension for use in printing a delineated curable liquid conductive ink coating defining the said circuit pattern to be formed upon the substrate surface;
   (b) preparing a supply web of a generally impervious flexible substrate to receive said circuit pattern and with bores being formed therein to accommodate electrical interconnects between circuit patterns to be formed on the opposed major surfaces thereof;
   (c) superimposing said flexible substrate upon a generally porous non-woven flexible vacuum diffusing carrier web pervious to air but impervious to said curable liquid conductive ink for simultaneous passage with said substrate as a web pair through a substrate printing zone;
   (d) passing said superposed substrate vacuum diffusing carrier web pair along a path within a substrate printing zone wherein said web pair is carried across a porous printing surface having an outer web pair contacting surface to provide a perforated web contacting surface, moving said porous printing surface in synchronism with the lineal movement of said superposed web pair so as to eliminate relative movement therebetween;
   (e) coupling the hollow core of said porous printing surface to a source of vacuum;
   (f) applying a layer of said curable liquid conductive ink coating upon the surface of said flexible substrate through said screen layout while simultaneously applying vacuum to the hollow core of said porous printing surface and through the bores formed through the annular wall thereof and through said air-pervious vacuum diffusing carrier web.

16. In the method of preparing conductive bridges to electrically couple discrete electrical conductors arranged in discrete layers in multiple layer form on opposed surfaces of a common substrate with the conductive bridge extending along and through the walls of a bore formed through the common substrate as a continuation of the respective opposed electrical conductors disposed adjacent the conductors bonded to the substrate surface, said method comprising the steps of:
   (a) preparing a screen layout of the circuit pattern to be formed and mounting said screen layout under tension for use in printing a delineated curable liquid conductive ink coating defining the said circuit pattern to be formed upon the substrate surface;
   (b) preparing a supply web of a generally impervious flexible substrate to receive said circuit pattern and with bores being formed therein to accommodate electrical interconnects between circuit patterns to be formed on the opposed major surfaces thereof;
   (c) superimposing said flexible substrate upon a generally porous non-woven flexible vacuum diffusing carrier web pervious to air but impervious to said curable liquid conductive ink for simultaneous passage with said substrate as a web pair through a substrate printing zone;
   (d) passing said superposed substrate vacuum diffusing carrier web pair along a path within a substrate printing zone wherein said web pair traverses at least a portion of the arcuate periphery of a printing cylinder having an outer annular wall surrounding a hollow core and with a plurality of bores formed through said annular wall to provide a perforated cylindrical surface, rotating said printing cylinder while carrying said web pair thereover at a peripheral rate of speed substantially equal to the lineal rate of speed of said superposed pair;
   (e) coupling the hollow core of said printing cylinder to a source of vacuum;
   (f) applying a layer of said curable liquid conductive ink coating upon the surface of said flexible substrate through said screen layout while simultaneously applying vacuum to the hollow core of said printing cylinder and through the bores formed through the annular wall thereof and through said air-pervious vacuum diffusing carrier web;

(g) curing said liquid conductive ink coating;

(h) repeating steps (c) through (g) to form layers of cured liquid conductive ink coatings on both opposed major surfaces of said substrate;

(i) plating a layer of a conductive metal onto the exposed surfaces of said cured conductive ink coating;

(j) applying a layer of a dielectric ink in a delineated pattern to the surfaces of said conductive metal layer and thereafter curing said dielectric ink conductive metallic layer;

(k) applying a second layer of a curable liquid conductive ink upon the surface of said cured dielectric layer, and thereafter curing said second curable liquid conductive ink layer; and (l) plating a layer of a conductive metal onto the exposed surfaces of said second cured conductive ink coating layer.

17. The method as described in claim 16 being particularly characterized in that said plated conductive metallic layers are selected from the group consisting of copper and nickel.

18. In the method of preparing conductive bridges through bores formed in a substrate to electrically coupled discrete electrical conductor layers arranged on opposed surfaces of a common substrate, with the conductive bridge extending along and through walls of a bore formed through the substrate as a continuation of the respective electrical conductors, said method comprising the steps of:

(a) preparing a screen layout of the circuit pattern to be formed and mounting said screen layout under tension for use in printing a delineated curable liquid conductive ink coating defining the said circuit pattern to be formed upon the substrate surface;

(b) preparing a supply web of a generally impervious flexible substrate to receive said circuit pattern on one surface of said flexible substrate and with bores being formed therein to accommodate electrical interconnects between the circuit patterns to be formed on said one surface of said flexible substrate and a circuit pattern disposed on a surface different from that of said flexible substrate surface;

(c) superimposing said flexible substrate upon a generally porous non-woven flexible vacuum diffusing carrier web pervious to air but impervious to said curable liquid conductive ink for simultaneous passage with said substrate as a web pair through a substrate printing zone;

(d) passing said superposed substrate vacuum diffusing carrier web pair along a path within a substrate printing zone where said web pair traverses at least a portion of the arcuate periphery of a printing cylinder having an outer annular wall surrounding a hollow core and with a plurality of bores formed through said annular wall to provide a perforated cylindrical surface, rotating said printing cylinder while carrying said web pair thereover at a peripheral rate of speed substantially equal to the lineal rate of speed of said superposed pair;

(e) coupling the hollow core of said printing cylinder to a source of vacuum;

(f) applying a first layer of said curable liquid conductive ink coating upon one surface of said flexible substrate through said screen layout while simultaneously applying vacuum to the hollow core of said printing cylinder and through the bores formed through the annular wall thereof and through said air-pervious vacuum diffusing carrier web;

(g) curing said liquid conductive ink coating;

(h) repeating steps (a) through (g) to form a continuation of said first layer of said curable liquid conductive ink coating upon the opposed surface of said flexible substrate so as to provide cured liquid conductive ink coatings on both opposed major surfaces of said substrate;

(i) plating a layer of a conductive metal to the exposed surfaces of said cured conductive ink coating;

(j) applying a layer of a dielectric ink in a delineated pattern to the surface of said conductive metallic layer and thereafter curing said dielectric ink layer;

(k) applying a second layer of a curable liquid conductive ink upon the surface of said cured dielectric layer, and thereafter curing said second curable liquid conductive ink layer; and (l) plating a second layer of a conductive metal to the exposed surfaces of said second cured conductive ink coating layer.

19. The method as described in claim 18 being particularly characterized in that said plated conductive metallic layer is selected from the group consisting of copper and nickel.

20. The method as defined in claim 19 wherein siad layers of conductive metal are plated in an electroplating operation.

* * * * *